(12) United States Patent
Liebmann et al.

(10) Patent No.: US 6,413,683 B1
(45) Date of Patent: Jul. 2, 2002

(54) METHOD FOR INCORPORATING SUB RESOLUTION ASSIST FEATURES IN A PHOTOMASK LAYOUT

(75) Inventors: Lars W. Liebmann, Poughquag; Scott M. Mansfield, Hopewell Junction, both of NY (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 09/602,966

(22) Filed: Jun. 23, 2000

(51) Int. Cl.⁷ .................................................. G03F 9/00
(52) U.S. Cl. ......................................................... 430/5
(58) Field of Search ........................ 430/5, 322; 716/19, 716/20, 21

(56) References Cited

U.S. PATENT DOCUMENTS

| | | |
|---|---|---|
| 5,447,810 A | 9/1995 | Chen et al. ..................... 430/5 |
| 5,821,014 A | 10/1998 | Chen et al. ..................... 430/5 |
| 5,885,734 A * | 3/1999 | Pierrat et al. ................... 430/5 |

OTHER PUBLICATIONS

S.M. Mansfield et al., "Lithographic Comparison of Assist Feature Design Strategies", IBM Microelectronics, (14 pp.) (2000).

J.F. Chen et al., "Optical Proximity Correction for Intermediate–Pitch Features Using Sub–Resolution Scattering Bars", MicroUnity Systems Engineering, Inc., J. Vac. Sci. Technol. B 15(6), (pp. 2426–2433) (Nov./Dec.1997).

J. Garofalo et al., "Mask Assisted Off–Axis Illumination Technique For Random Logic", AT&T Bell Laboratories, J. Vac. Sci. Technol. B 11(6) (pp. 2651–2658) (Nov./Dec. 1993).

* cited by examiner

*Primary Examiner*—S. Rosasco
(74) *Attorney, Agent, or Firm*—Ratner & Prestia; Tiffany L. Townsend, Esq.

(57) ABSTRACT

A method for developing a photomask layout by which an electrical circuit is imaged that includes introducing sub resolution assist features into a photomask layout by (1) sorting selected details of the main electrical circuit undergoing enhancement according to a predetermined order of importance of enhancement of the selected details of the main electrical circuit to the overall performance of the main electrical circuit, (2) establishing a prioritization for sub resolution assist features associated with the selected details of the main electrical circuit based on the predetermined order of importance of the selected details of the main electrical circuit with which the sub resolution assist features are associated, and (3) incorporating sub resolution assist features in the photomask layout in accordance with the established prioritization of the sub resolution features.

18 Claims, 5 Drawing Sheets

METHOD FOR INCORPORATING SUB RESOLUTION ASSIST FEATURES IN A PHOTOMASK LAYOUT

TECHNICAL FIELD

The present invention relates, in general, to the fabrication of integrated circuits and, in particular, to a method of imaging electrical circuit patterns that includes the incorporation of sub resolution assist features in the photomask layout by which electrical circuit patterns are imaged.

BACKGROUND OF THE INVENTION

Sub resolution assist features, also known as scattering bars, that are incorporated in photomask layouts provide significant lithographic benefit in the imaging of VLSI circuit patterns. The theory of sub resolution assist features and the mechanics of sub resolution assist feature design are well documented in technical papers and patents. The following are but three examples.

U.S. Pat. No. 5,821,014 relates to a method for providing scattering bars (i.e., sub resolution assist features) for optical proximity effect correction on a mask used in a lithographic process. In this patent, the spacing and characteristics of the scattering bars are adjusted and varied along with main feature edge locations to control the critical dimensions of features that are spaced at distances greater than the minimum pitch of the lithographic process but less than a nominal distance for two feature edges having independent scattering bars.

U.S. Pat. No. 5,447,810 relates to masks used in a lithographic tool utilizing off-axis illumination to provide increased depth of focus and to minimize critical dimension differences between certain features.

"Lithographic Comparison of Assist Feature Design Strategies" by Scott M. Mansfield, Lars W. Liebmann, Antoinette F. Molless and Alfred K. Wong IBM Microelectronics dated Mar. 1, 2000 relates to the design tradeoffs in using sub resolution assist features in conjunction with off-axis illumination to reduce proximity effects, while improving the lithographic process window.

Development and optimization of sub resolution assist features are done in a predominantly one-dimensional environment. As shown in FIG. 1, for main details 10, shown by diagonal cross-hatch, the rules for spacings and widths of sub resolution assist features 12, shown by horizontal cross-hatch, are calculated and created for lines of varying pitch (i.e., the distances between main details 10). An edge of a main detail can have two or one or no sub resolution assist features. A space, defined by two edges of two main details, can have four or three or two or one or no sub resolution assist features.

Several problems arise in applying the one dimensional sub resolution assist feature rules to real two dimensional circuit layouts. All these problems can generally be described as layout situations for which no sub resolution assist feature design rules exist. Expanding the sub resolution assist feature design rules to incorporate sub resolution assist feature design instructions for every conceivable layout combination would result in a prohibitively large rule set. It is, therefore, necessary for the sub resolution assist feature design tool to extrapolate sub resolution assist feature design instructions outside of the provided rule set. In some cases, this extrapolation is particularly difficult, such as in the case illustrated in FIG. 2 where a group of vertical main details 14, shown by diagonal cross-hatch, borders against a single horizontal detail 16, also shown by diagonal cross-hatch. The horizontal edges 18a of sub resolution assist features 18, shown by horizontal cross-hatch in FIG. 2, are classified as isolated edges (i.e., there are no sub resolution assist feature proximity neighbors).

The instructions for the design of the vertical sub resolution assist features are directly covered in the one dimensional rules. But these same rules would classify the lower edge of horizontal main detail 16 as a combination of three isolated edge segments (i.e., no neighboring details) where the horizontal edge is opposed by the spaces between the vertical lines and two nested edge segments (i.e., with close neighboring structure) where the horizontal edge is opposed by the vertical line ends. This classification, which is based on the one dimensional rules derived from layout situations in which neighboring edges share significant runlength (e.g., FIG. 1), will introduce an error (i.e., sub resolution assist features of wrong size and spacing will be drawn) in this layout situation that is characterized by a series of short and vastly different proximity environments. The error is further increased by the fact that edge classification operation that determines which sub resolution assist feature rules to apply to each edge segment is unaware of the sub resolution assist features that will be drawn in the horizontal spaces at the time the classification is made.

An example of a layout situation where the extrapolation of the one dimensional tables to the two dimensional layout is done correctly based on the instructions provided, but yields poor sub resolution assist feature coverage (i.e., significant portions of the main detail are opposed by no sub resolution assist features or sub resolution assist features of the wrong size and spacing) is shown in FIG. 3. Based on the one dimensional instructions, an inside corner in main detail 20 will yield concentric L-shaped sub resolution assist features 22a, 22b, 22c and 22d. Over the region A in FIG. 3, the horizontal edge segment of main detail 20 is opposed not by parallel sub resolution assist features but by a combination of perpendicular sub resolution assist features, the corresponding sub resolution assist feature spaces, and some partial horizontal sub resolution assist feature segments. The poor control over the sub resolution assist feature design over region A will result in lithographic process window loss for that segment of main detail 20 and will cause linewidth control problems to the point of complete image loss (i.e., printing problems generally termed necking).

FIG. 4 illustrates another layout situation in which the one dimensional rules result in poor sub resolution assist feature design. The region identified as B in FIG. 4 is characterized by a significant discontinuity in the proximity environment. The bottom horizontal main detail 24 transitions from being a nested main feature to being completely isolated, while the top main detail 26 turns a sharp corner. Further, neither the top horizontal edge 24a of the bottom main detail 24 nor the left vertical edge 26a of the top main detail 26 are visible to each other in the sub resolution assist feature design (i.e., the measurements taken on these edge segments to classify the proximity environment are unaware of the perpendicular edges in the proximity environment). The result of applying the one dimensional rules to this layout situation is that sub resolution assist features suitable for isolated edges (i.e., no neighboring details) are generated for both the left half of the top horizontal edge 24a of the bottom main detail 24 and the left vertical edge 26a of the top main detail 26. The resulting intersecting and overlapping sub resolution assist features cause not only imaging problems to the main details, as described above, but the fact that such a high area percentage is covered by sub resolution assist features will cause significant image intensity loss and will result in images being printed on the wafer by the sub resolution assist features that are nominally intended to be sub resolution.

The only feasible solution to the high density of sub resolution assist features in region B is shown in FIG. 5. Here, all sub resolution assist feature portions that overlapped have been removed from the design, the resulting narrow spaces between sub resolution assist features were then grown to the minimum spacing value allowed by the particular mask and lithography process, and finally any sub resolution assist feature segments that were left with a length below the minimum sub resolution assist feature length after these cleanup steps are removed to avoid mask inspection problems. The result is an area of significant extent in which no sub resolution assist features remain to perform the image enhancement tasks for which they were intended. This, in turn, will result in poor imaging (e.g., small process window and large feature size variation) on all main details bordering region B.

In addition to the layout situations described above, non-parallel projecting edges (i.e., edges between orthogonal lines and angled lines) are very poorly handled by the one dimensional rules.

SUMMARY OF THE INVENTION

It is an objective of the present invention to provide a new and improved method for developing a photomask layout by which an electrical circuit is imaged.

It is another objective of the present invention to provide a new and improved method for introducing sub resolution assist features onto a photomask layout by which an electrical circuit is imaged.

It is a further objective of the present invention to provide a new and improved method for introducing sub resolution assist features onto a photomask layout by which an electrical circuit including a transistor and associated wiring is imaged.

To achieve these and other objectives, a method for developing a photomask layout by which an electrical circuit is imaged in accordance with the present invention includes the steps of developing a main electrical circuit in a photomask layout and developing sub resolution assist features in the photomask layout for selected details of the main electrical circuit. The sub resolution assist features are developed by performing the following steps. Selected details of the main electrical circuit undergoing enhancement are sorted according to a predetermined order of importance of enhancement of the selected details of the main electrical circuit to the overall performance of the main electrical circuit. A prioritization of the sub resolution assist features associated with the selected details of the main electrical circuit, based on the predetermined order of importance of the selected details of the main electrical circuit with which the sub resolution assist features are associated, is established. The sub resolution assist features then are incorporated in the photomask layout in accordance with the established prioritization of the sub resolution features.

BRIEF DESCRIPTION OF THE DRAWINGS

The invention is best understood from the following detailed description when read in conjunction with the accompanying drawings.

DETAILED DESCRIPTION OF THE INVENTION

Although the invention will be described in connection with the development of a main circuit composed of a transistor and associated wiring, it will be understood that the invention has broader applications.

Figure 6:
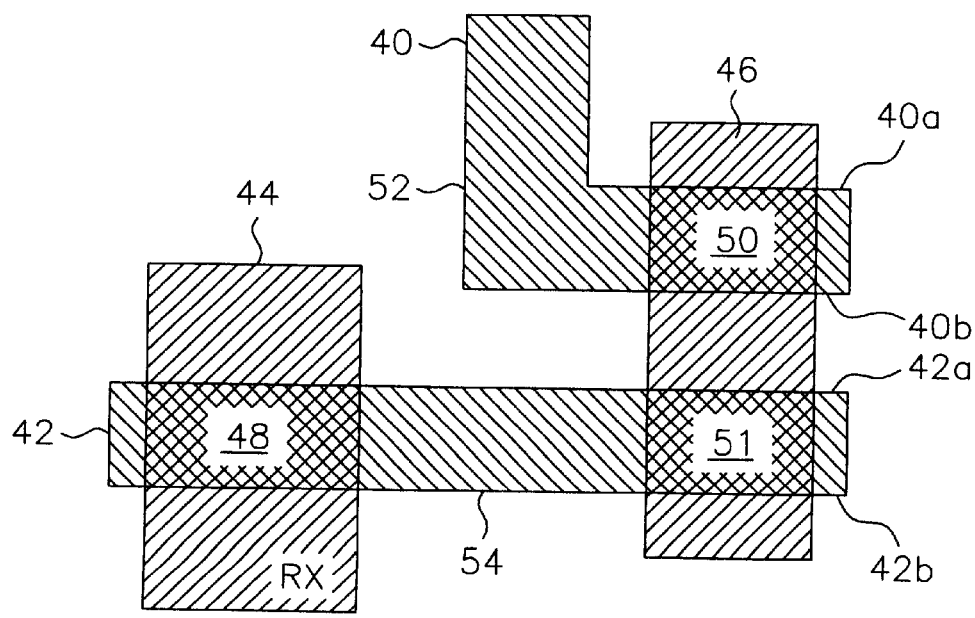
FIG. 6 is schematic illustration of a photomask layout having only a main electrical circuit.

A method for developing a photomask layout by which an electrical circuit is imaged, in accordance with the present invention, includes the step of developing a main electrical circuit in a photomask layout. For the embodiment of the invention being described, the main electrical circuit includes a plurality of transistors and wiring associated with each of the transistors as shown in FIG. 6. The most important segment of the poly conductor level is the region that forms the active transistor. These regions are identified in the photomask layout as the intersection of the poly conductor shapes 40 and 42 and the shapes defining the diffusion regions 44 and 46. The intersections of the poly conductor shapes 40 and 42 and the shapes defining the diffusion regions 44 and 46 are identified by reference numerals 48 and 50. The edges identified by reference numerals 40a, 40b, 42a and 42b are critical edges.

A method for developing a photomask layout by which an electrical circuit is imaged, in accordance with the present invention, also includes the step of developing sub resolution assist features in the photomask layout for selected details of the main electrical circuit. This is accomplished by sorting selected details of the main electrical circuit undergoing enhancement according to a predetermined order of importance of enhancement of the selected details of the main electrical circuit to the overall performance of the main electrical circuit. For example and with reference to FIG. 6, when the main electrical circuit includes a plurality of transistors and wiring associated with each of the transistors, the gates of the transistors (i.e., poly over diffusion) 48, 50 and 51, shown by double diagonal cross hatch, and the wiring associated with the transistors (i.e., poly not over diffusion) 52 and 54 are sorted separately. The resulting pieces are further sorted into orthogonal (i.e., horizontal and vertical pieces) and non-orthogonal (i.e., all angled pieces) as these pieces are disposed on the photomask layout. There are no non-orthogonal pieces in FIG. 6.

The next step in developing sub resolution assist features in the photomask layout is establishing a prioritization for sub resolution assist features associated with the selected details of the main electrical circuit based on the predetermined order of importance of the selected details of the main electrical circuit with which the sub resolution assist features are associated. In other words, as the priority of the details of the main electrical circuit is established, the sub resolution assist features assume the same priority as the main circuit details with which the sub resolution features are associated.

As indicated above, for a main electrical circuit having a plurality of transistors and wiring associated with each of the transistors as shown in FIG. 6, the most important segment of the poly conductor level is the region that forms the active transistor, namely the intersections 48, 50 and 51 of the poly conductor shapes 40 and 42 and the shapes defining the diffusion regions 44 and 46. These intersections are shown by double diagonal cross hatch. The edges identified by reference numerals 40*a*, 40*b*, 42*a* and 42*b* also are critical.

Among the factors considered in establishing the predetermined order of importance of enhancement of the selected details of the main electrical circuit are orientation and size of selected details of the main electrical circuit and inter level and intra level interactions between selected details of the main electrical circuit. When, for example, the main electrical circuit includes a plurality of transistors and wiring associated with each of the transistors, prioritization of the sub resolution features associated with the gates of the transistors and the wiring associated with the transistors is as follows:

(1) gates of the transistors that are disposed orthogonally (2) gates of the transistors that are disposed non-orthogonally (3) wiring associated with the transistors that is disposed orthogonally (4) wiring associated with the transistors that is disposed non-orthogonally In an electrical circuit having gates and wiring, gates are more important to the operation of the electrical circuit than are the wiring. Consequently, gates are given priority over wiring.

It is common practice to have greater tolerances on non-orthogonal wiring of electrical circuits than the tolerances on orthogonal wiring. Consequently, with more room for error designed into the non-orthogonal wiring, there is less need to be concerned about the accuracy of non-orthogonal wiring, with the result that orthogonal wiring is given priority over non-orthogonal wiring.

Establishing a prioritization for sub resolution assist features further includes giving priority to sub resolution assist features closest to the main electrical circuit over outer sub resolution assist features furthest from the main circuit. In other words, inner sub resolution assist features are given priority over outer sub resolution assist features.

The next step in developing sub resolution assist features in the photomask layout is incorporating sub resolution assist features in the photomask layout in accordance with the established prioritization of the sub resolution features. Incorporating the sub resolution assist features in the photomask layout can be accomplished in a number of ways.

One way of incorporating sub resolution assist features in the photomask layout is by incorporating the sub resolution assist features in the order of the established priority taking into account, during the incorporation of sub resolution assist features, the sub resolution assist features that have previously been incorporated in the photomask layout. Another way of incorporating sub resolution assist features in the photomask layout is by incorporating the sub resolution assist features in the order of the established priority ignoring previously incorporated sub resolution assist features and then cleaning out violations of sub resolution assist feature rules. The latter procedure will be described in connection with FIGS. 7, 8 and 9 which again illustrate a main electrical circuit having a plurality of transistors and wiring associated with each of the transistors.

Figure 7:
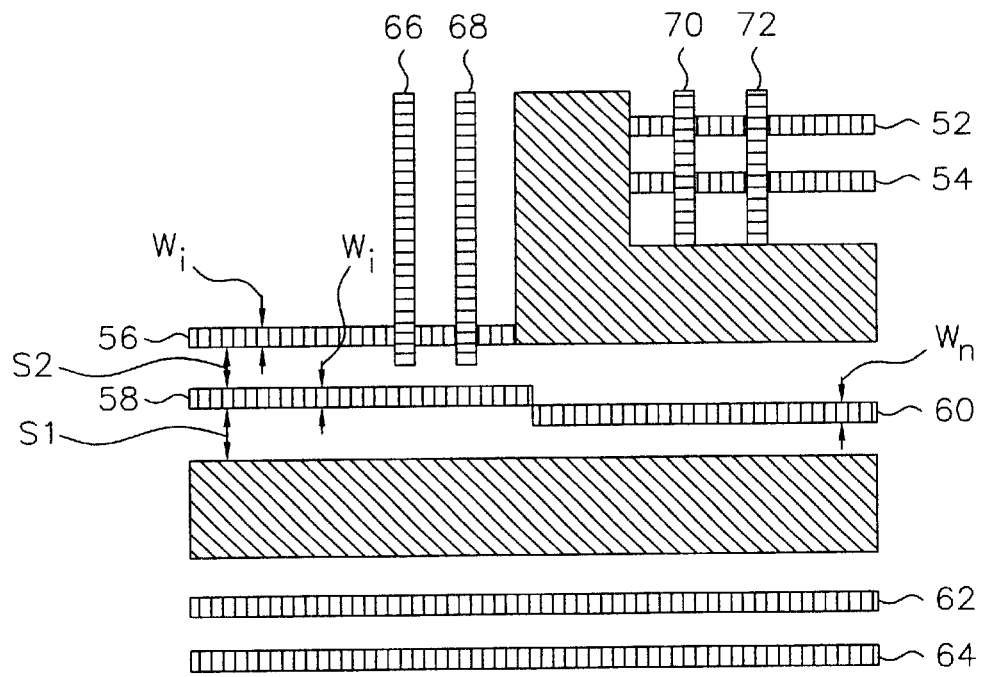
FIGS. 7, 8 and 9 are schematic illustrations of the incorporation of sub resolution assist features in a photomask layout.

Referring to FIG. 7, sub resolution assist features first are incorporated for all shapes forming active transistors, taking all of the poly conductor shapes into account as proximity environment. These sub resolution assist features are identified by reference numerals 52, 54, 56, 58, 60, 62 and 64. Next, sub resolution assist features are incorporated for shapes forming other than transistors of the poly conductor layout. These sub resolution assist features are identified by reference numerals 66, 68, 70 and 72. As shown, the incorporation of these sub resolution assist features takes into account only the poly conductor shapes and ignores the previously incorporated sub resolution assist features 52, 54, 56, 58, 60, 62 and 64.

Figure 8:
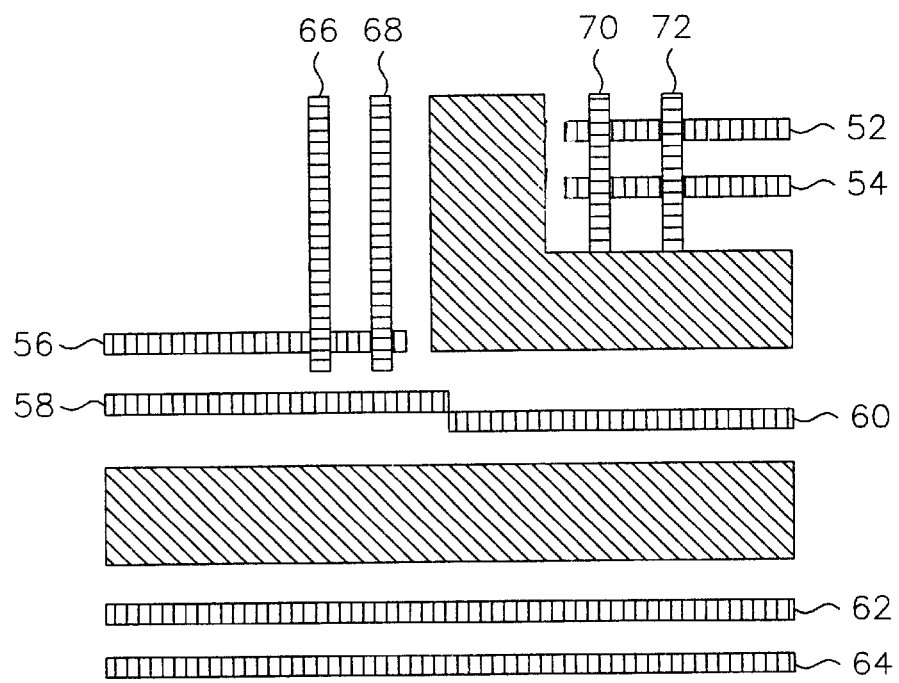

Referring to FIG. 8, the sub resolution assist feature clean up, namely removal of selected sub resolution assist features, proceeds in the same order of priority as the sub resolution assist features were incorporated in the photomask layout. Removal of selected sub resolution assist features can involve either removal of the entire sub resolution assist feature or only a portion of the sub resolution assist feature.

First is the removal of those sub resolution assist features that are associated with active transistors, namely those sub resolution assist features identified by reference numerals 52, 54 and 56. Only portions of these sub resolution assist features have been removed.

Figure 9:
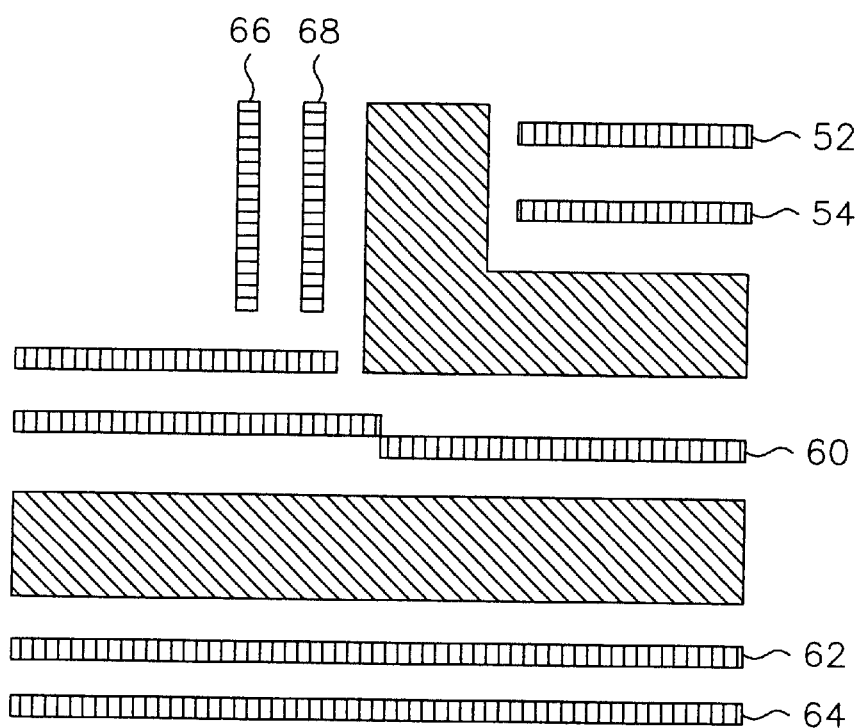

Next is the removal of those sub resolution assist features that are associated with non-transistor details of the main electrical circuit, namely those sub resolution assist features identified by reference numerals 66 and 68 and 70 and 72 in FIG. 8. As shown by FIG. 9, only portions of sub resolution assist features 66 and 68 of FIG. 8 have been removed, while sub resolution assist features 70 and 72 of FIG. 8 have been removed entirely.

Figure 5:
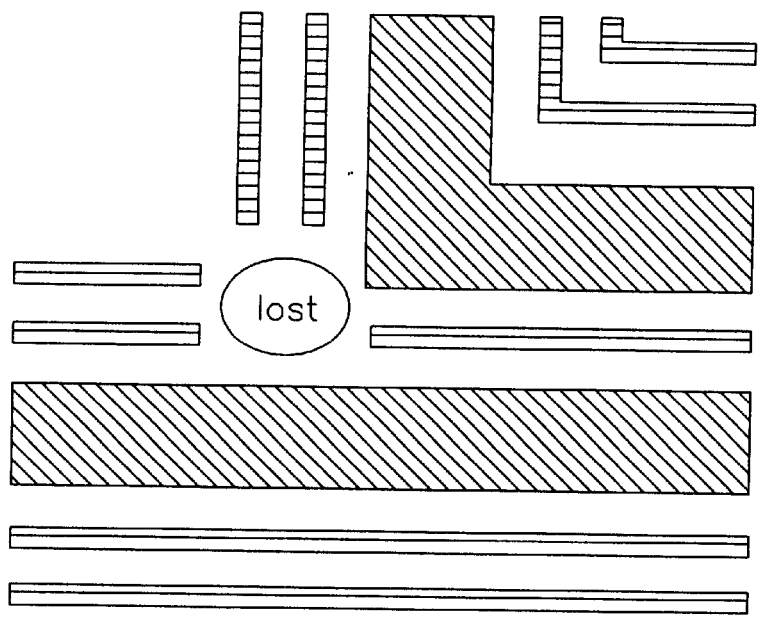
FIG. 5 is a schematic illustration of the FIG. 4 example of incorporation of sub resolution assist features in a photomask layout after cleanup.

The benefit of the procedure just described can be seen by comparing FIG. 9 to FIG. 5.

It will be understood that the FIG. 9 photomask layout can be achieved, as indicated above, by incorporating sub resolution assist features on a priority basis but not ignoring the previously incorporated sub resolution assist features. By proceeding in this manner, the step of cleaning up (i.e., removing) selected sub resolution assist features is spared.

Yet another way that the sub resolution assist features can be incorporated in the photomask layout is by incorporating all the sub resolution assist features simultaneously and then removing certain of the sub resolution assist features on a selective basis. Again, with this approach as with the second approach described above in connection with FIGS. 7, 8 and 9, more sub resolution assist features are incorporated in the photomask layout initially than will be present when the photomask layout is used to image the main electrical circuit. Selected sub resolution assist features are removed partially or entirely in a reverse order of the established priority, starting with that sub resolution assist feature having the lowest priority, with the final result being the same as shown by FIG. 9.

Figure 1:
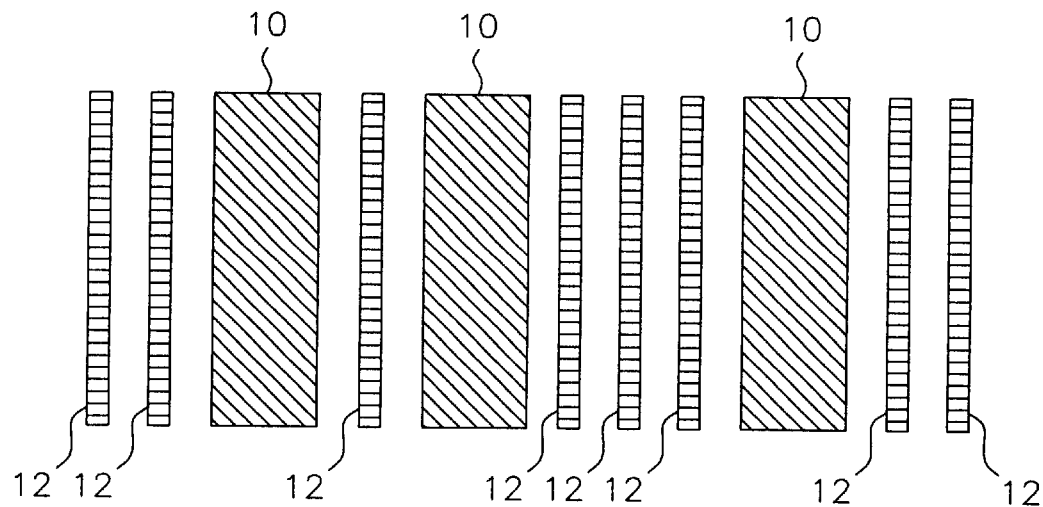
FIG. 1 is a schematic illustration of a first example of incorporation of sub resolution assist features in a photomask layout.
Figure 2:
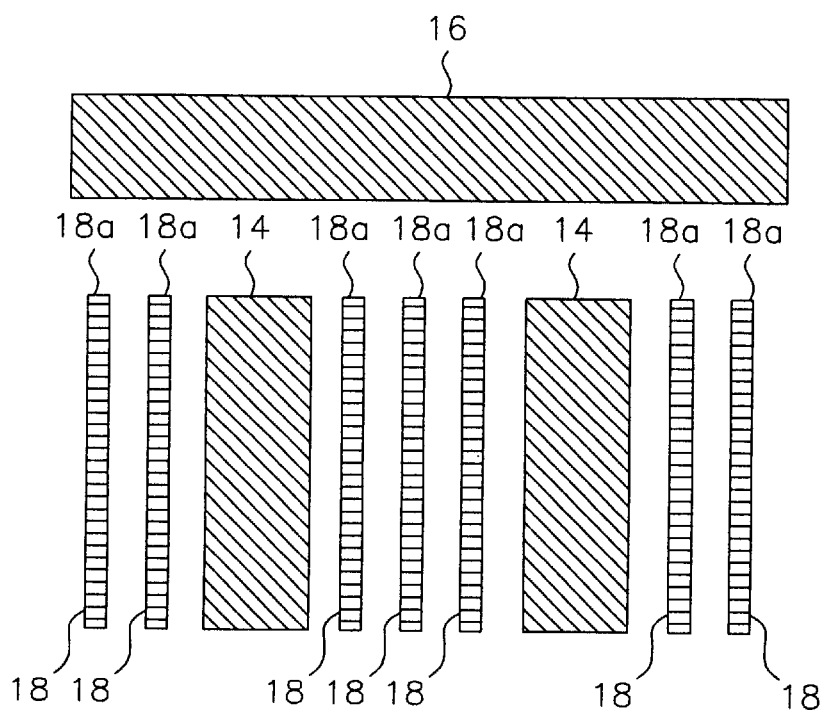
FIG. 2 is a schematic illustration of a second example of incorporation of sub resolution assist features in a photomask layout.
Figure 3:
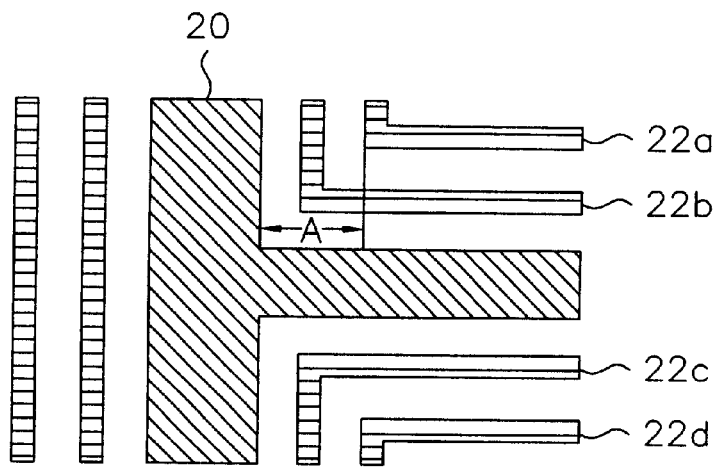
FIG. 3 is a schematic illustration of a third example of incorporation of sub resolution assist features in a photomask layout.
Figure 4:
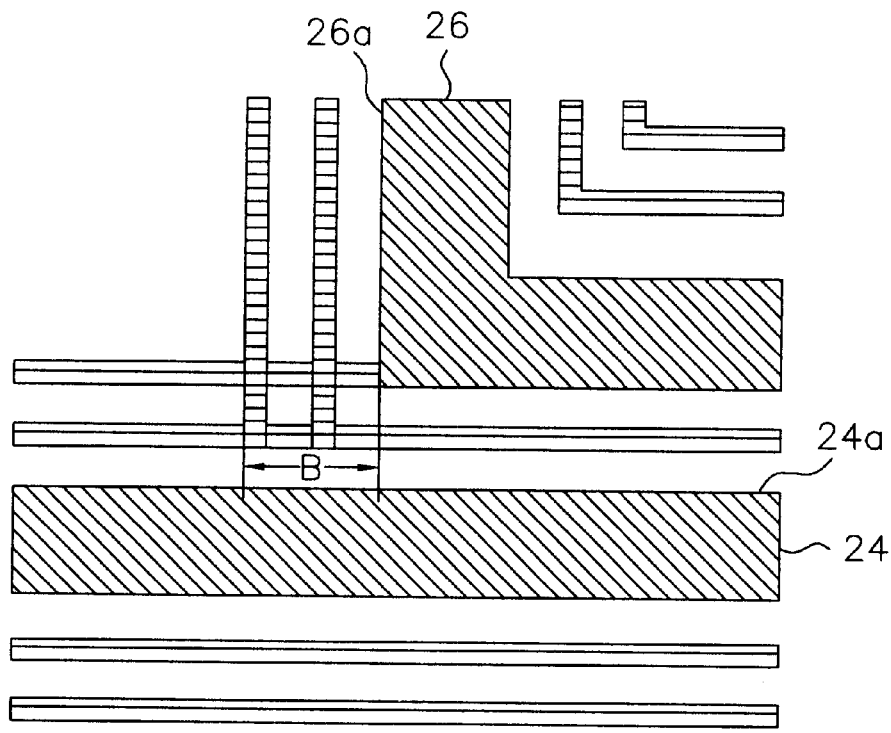
FIG. 4 is a schematic illustration of a fourth example of incorporation of sub resolution assist features in a photomask layout prior to cleanup.

To the sub resolution assist feature design tool, based on one dimensional sub resolution assist feature rules, the simple layout example shown in FIG. 6 can be described as several isolated edge segments (i.e., edges with no opposing neighbors) and several tightly nested edge segments (i.e., the gap between main details 40 and 42). So the entire sub resolution assist feature design for this example can be controlled by two basic instructions: (1) for all isolated edges, add two sub resolution assist features of width Wi and spacing S1 and S2, and (2) for all nested edges, add one sub resolution assist feature of width Wn in the center of the space formed by opposing nested edges. The result of applying these instructions to the layout for all edges simultaneously is shown in FIG. 4. Applying these instructions sequentially in order of detail edge priority but without regard to previously generated sub resolution assist features, results in a layout as shown in FIG. 7.

Although described and illustrated above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A method for developing a photomask layout by which an electrical circuit is imaged comprising the steps of:

developing a main electrical circuit in a photomask layout; and developing sub resolution assist features in the photomask layout for selected details of the main electrical circuit by performing the following steps:

(a) sorting selected details of the main electrical circuit undergoing enhancement according to a predetermined order of importance of enhancement of the selected details of the main electrical circuit to the overall performance of the main electrical circuit, (b) establishing a prioritization for sub resolution assist features associated with the selected details of the main electrical circuit based on the predetermined order of importance of the selected details of the main electrical circuit with which the sub resolution assist features are associated, and (c) incorporating sub resolution assist features in the photomask layout in accordance with the established prioritization of the sub resolution features.

2. A method for developing a photomask layout according to claim 1 wherein the step of incorporating sub resolution features in the photomask layout includes:

(a) simultaneously incorporating in the photomask layout more sub resolution assist features than will be present when the photomask layout is used to image the main electrical circuit, and (b) removing selected sub resolution assist features in a reverse order of the established priority starting with that sub resolution assist feature having the lowest priority.

3. A method for developing a photomask layout according to claim 1 wherein the step of incorporating sub resolution features in the photomask layout includes incorporating the sub resolution assist features in the order of the established priority taking into account during the incorporation of sub resolution assist features the sub resolution assist features that have previously been incorporated in the photomask layout.

4. A method for developing a photomask layout according to claim 1 wherein the step of incorporating sub resolution features in the photomask layout includes:

(a) incorporating the sub resolution assist features in the order of the established priority without taking into account during the incorporation of the sub resolution assist features the sub resolution assist features that have been previously incorporated in the photomask layout, and (b) removing selected sub resolution assist features in the same order of the established priority starting with that sub resolution assist feature having the highest priority.

5. The method for developing a photomask layout according to claim 1 wherein:

(a) the main electrical circuit includes a plurality of transistors and wiring associated with each of the transistors, (b) the gates of the transistors and the wiring associated with the transistors are sorted separately, and (c) prioritization of the sub resolution features associated with the gates of the transistors and the wiring associated with the transistors is:

(1) gates of the transistors that are disposed orthogonally (2) gates of the transistors that are disposed non-orthogonally (3) wiring associated with the transistors that is disposed orthogonally (4) wiring associated with the transistors that is disposed nonorthogonally.

6. The method for developing a photomask layout according to claim 1 wherein:

(a) orientation and size of selected details of the main electrical circuit, and (b) inter level and intra level interactions between selected details of the main electrical circuit are factors in establishing the predetermined order of importance of enhancement of the selected details of the main electrical circuit.

7. The method for developing a photomask layout according to claim 1 wherein establishing a prioritization for sub resolution assist features further includes giving priority to sub resolution assist features closest to the main electrical circuit over sub resolution assist features furthest from the main circuit.

8. A method for introducing sub resolution assist features onto a photomask layout by which an electrical circuit is imaged comprising the steps of:

sorting selected details of a main electrical circuit considered for undergoing enhancement into groupings according to a predetermined order of importance of the selected details of the main electrical circuit to the overall performance of the main electrical circuit based on interaction of the selected details of the main electrical circuit with one another;

prioritizing sub resolution assist features associated with the selected details of the main electrical circuit based on the predetermined order of importance of the selected details of the main electrical circuit with which the sub resolution assist features are associated; and developing sub resolution assist features on the photomask.

9. The method for introducing sub resolution assist features onto a photomask layout according to claim 8 wherein the step of incorporating sub resolution features in the photomask layout includes:

(a) simultaneously incorporating in the photomask layout more sub resolution assist features than will be present when the photomask layout is used to image the main electrical circuit, and (b) removing selected sub resolution assist features in a reverse order of the established priority starting with that sub resolution assist feature having the lowest priority.

10. A method for introducing sub resolution assist features onto a photomask layout according to claim 8 wherein the step of incorporating sub resolution features in the photomask layout includes incorporating the sub resolution assist features in the order of the established priority taking into account during the incorporation of sub resolution assist features the sub resolution assist features that have previously been incorporated in the photomask layout.

11. A method for developing a photomask layout according to claim 8 wherein the step of incorporating sub resolution features in the photomask layout includes:

(a) incorporating the sub resolution assist features in the order of the established priority without taking into account during the incorporation of the sub resolution assist features the sub resolution assist features that have been previously incorporated in the photomask layout, and (b) removing selected sub resolution assist features in the same order of the established priority starting with that sub resolution assist feature having the highest priority.

12. The method for introducing sub resolution assist features onto a photomask layout according to claim 8 wherein:

(a) the main electrical circuit includes a plurality of transistors and wiring associated with each of the transistors, (b) the gates of the transistors and the wiring associated with the transistors are sorted separately, and (c) prioritization of the sub resolution features associated with the gates of the transistors and the wiring associated with the transistors is:

(1) gates of the transistors that are disposed orthogonally (2) gates of the transistors that are disposed non-orthogonally (3) wiring associated with the transistors that is disposed orthogonally (4) wiring associated with the transistors that is disposed non-orthogonally.

13. A method for introducing sub resolution assist features onto a photomask layout according to claim 8 wherein:

(a) orientation and size of selected details of the main electrical circuit, and (b) inter level and intra level interactions between selected details of the main electrical circuit are factors in establishing the predetermined order of importance of enhancement of the selected details of the main electrical circuit.

14. The method for developing a photomask layout according to claim 8 wherein establishing a prioritization for sub resolution assist features further includes giving priority to sub resolution assist features closest to the main electrical circuit over sub resolution assist features furthest from the main circuit.

15. A method for introducing sub resolution assist features onto a photomask layout by which an electrical circuit including a transistor and associated wiring is imaged comprising the steps of:

developing a main electrical circuit including a transistor and wiring associated with the transistor on a photomask; and developing sub resolution assist features on the photomask for selected details of the main electrical circuit including the gate of the transistor and the wiring associated with the transistor by performing the following steps:

(a) sorting the gate of the transistor and the wiring associated with the transistor according to a predetermined order of greater importance of the gate of the transistor over the wiring associated with the transistor to the overall performance of the main electrical circuit based on interaction of the gate of the transistor with the wiring associated with the transistor, (b) prioritizing sub resolution assist features associated with the gate of the transistor and the wiring associated with the transistor based on the predetermined order of importance of the gate of the transistor over the wiring associated with the transistor, and (c) developing sub resolution assist features associated with the gate of the transistor and the wiring associated with the transistor on the photomask.

16. The method for introducing sub resolution assist features onto a photomask layout according to claim 15 wherein the step of incorporating sub resolution features in the photomask layout includes:

(a) simultaneously incorporating in the photomask layout more sub resolution assist features than will be present when the photomask layout is used to image the main electrical circuit, and (b) removing selected sub resolution assist features in a reverse order of the established priority starting with that sub resolution assist feature having the lowest priority.

17. A method for developing a photomask layout according to claim 15 wherein the step of incorporating sub resolution features in the photomask layout includes incorporating the sub resolution assist features in the order of the established priority taking into account during the incorporation of sub resolution assist features the sub resolution assist features that have previously been incorporated in the photomask layout.

18. A method for developing a photomask layout according to claim 15 wherein the step of incorporating sub resolution features in the photomask layout includes:

(a) incorporating the sub resolution assist features in the order of the established priority without taking into account during the incorporation of the sub resolution assist features the sub resolution assist features that have been previously incorporated in the photomask layout, and (b) removing selected sub resolution assist features in the same order of the established priority starting with that sub resolution assist feature having the highest priority.

* * * * *